(12) United States Patent
Yeh et al.

(10) Patent No.: US 12,033,951 B2
(45) Date of Patent: Jul. 9, 2024

(54) ALIGNMENT MARK STRUCTURE AND METHOD FOR MAKING

(71) Applicant: Taiwan Semiconductor Manufacturing Company, Ltd., Hsinchu (TW)

(72) Inventors: Tzu-Hao Yeh, Hsinchu (TW); Kuan-Jung Chen, Hsinchu (TW); Tsung-Lin Lee, Taipei (TW); Shiuan-Jeng Lin, Hsinchu (TW); Hung-Lin Chen, Pingtung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 217 days.

(21) Appl. No.: 17/404,264

(22) Filed: Aug. 17, 2021

(65) Prior Publication Data
US 2022/0359416 A1 Nov. 10, 2022

Related U.S. Application Data

(60) Provisional application No. 63/185,564, filed on May 7, 2021.

(51) Int. Cl.
*H01L 23/544* (2006.01)
*G03F 9/00* (2006.01)

(52) U.S. Cl.
CPC .......... *H01L 23/544* (2013.01); *G03F 9/7076* (2013.01); *G03F 9/708* (2013.01); *H01L 2223/54426* (2013.01); *H01L 2223/5446* (2013.01)

(58) Field of Classification Search
CPC ......... H01L 23/544; H01L 2223/54426; G03F 9/708; G03F 9/7076
See application file for complete search history.

(56) References Cited

U.S. PATENT DOCUMENTS

| 7,338,909 B2* | 3/2008 | Lin ................... H01L 21/67282 257/E21.228 |
| 10,061,193 B2* | 8/2018 | Shih .......................... G03F 1/26 |
| 10,937,946 B2* | 3/2021 | Wang ..................... H10N 50/01 |
| 11,322,682 B2* | 5/2022 | Wang ..................... H10N 50/10 |
| 2006/0223271 A1* | 10/2006 | Hara ................... H01L 27/1203 257/E23.179 |
| 2008/0315373 A1* | 12/2008 | Yang ....................... G03F 9/708 257/659 |
| 2009/0243123 A1* | 10/2009 | Meisner ................ G03F 9/7084 257/E23.179 |
| 2012/0012857 A1* | 1/2012 | Kuraguchi .............. G03F 9/708 257/E23.179 |

(Continued)

FOREIGN PATENT DOCUMENTS

| CN | 101576714 A | 11/2009 |
| CN | 107037687 A | 8/2017 |

(Continued)

*Primary Examiner* — Bilkis Jahan
*Assistant Examiner* — Victor V Barzykin
(74) *Attorney, Agent, or Firm* — Lippes Mathias LLP

(57) ABSTRACT

The reflectance of a low-reflectance alignment mark is increased by coating the alignment mark with a high-reflectance film layer. This improves the strength of the light signal and reduces variation in the light signal.

20 Claims, 17 Drawing Sheets

(56) References Cited

U.S. PATENT DOCUMENTS

| | | | | |
|---|---|---|---|---|
| 2012/0038021 A1* | 2/2012 | Chen | .................... | G03F 9/7084 |
| | | | | 430/323 |
| 2013/0330907 A1* | 12/2013 | Lutz | ................. | H01L 21/76283 |
| | | | | 257/E21.546 |
| 2020/0135538 A1* | 4/2020 | Huang | .............. | H01L 21/31058 |

FOREIGN PATENT DOCUMENTS

| TW | 201015207 A | 4/2010 |
|---|---|---|
| WO | 2007008088 A1 | 1/2007 |

\* cited by examiner

ALIGNMENT MARK STRUCTURE AND METHOD FOR MAKING

PRIORITY CLAIM AND CROSS-REFERENCE

This application claims priority to U.S. Provisional Patent Application Ser. No. 63/185,564, filed on May 7, 2021, which is incorporated by reference in its entirety.

BACKGROUND

Photolithographic patterning processes use a reticle (i.e. photomask) that includes a desired mask pattern. Ultraviolet light is used to transfer the pattern to a photoresist on a semiconductor wafer, and the desired pattern is used to produce a layer on the wafer substrate. This process is repeated multiple times with different patterns to build different layers on the wafer substrate and make a useful device.

The patterns for different lithography steps that belong to a single structure must be aligned to one another. Alignment marks, which are high precision features that are used as a reference for registering or aligning subsequent patterns to the rest of the layers, are thus present in one or more of the patterns transferred to a wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
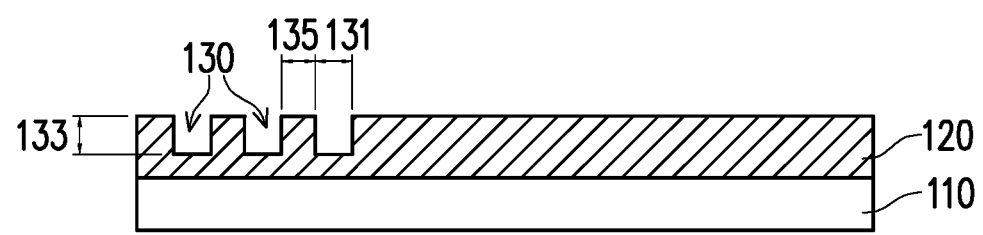
FIG. 1 is a cross-sectional illustration of an alignment mark, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to methods for improving alignment procedures in photolithography processes on semiconducting wafer substrates used to produce transistors, integrated circuits, and microchips. In this regard, when aligning the pattern on the reticle to its desired location on the wafer substrate, a laser is used to provide incident light, in some embodiments. The laser passes through alignment marks on the reticle and then reflects off the corresponding alignment marks on the wafer substrate.

FIG. 1 is a side cross-sectional view of an alignment mark on a semiconductor wafer substrate, in accordance with some embodiments of the present disclosure. The substrate 110 can be, for example, a wafer made of silicon, germanium arsenide (GaAs), or gallium nitride (GaN), and other materials are also contemplated as being within the scope of this disclosure. In particular embodiments, the methods described in the present disclosure use silicon wafers as the substrate, as illustrated here. A metal film 120 is present upon the wafer substrate 110. An alignment mark is illustrated as a set of trenches 130 or scribe line marks (SLM). Scribe Line Marks (SLM) printed on substrates are a standard method used by modern scanners for wafer alignment. The bottom of each trench may have a width 131 of about 7 micrometers (µm) to about 10 µm, in accordance with some embodiments, although they may have any other width as well. Each trench may have a depth 133 which is based on the wavelength of the laser that provides the incident light. In accordance with some embodiments, the depth of the trench may be from about 1,500 angstroms to about 1,700 angstroms, although they may have any other depth as well. The distance 135 between adjacent trenches, or the top width of the trench, may range from about 7 µm to about 10 µm, in accordance with some embodiments, although they may have any other width as well. However, as will be seen later, the bottom width and the depth of the trenches in the alignment mark is usually held constant, while the distance between adjacent trenches may vary.

Generally, the light reflected from the alignment mark is detected by alignment optics. The alignment optics can include various components such as lenses, mirrors, condensers, etc. The light is then analyzed to determine the relative location of the wafer with its desired position. For example, light reflected from the scribe line marks can form a diffraction pattern. In some instances, multiple different wavelengths can be used to provide multi-wavelength alignment measurements. The diffracted light patterns can be used to determine the alignment error or overlay error, which then provides a control signal for moving the wafer substrate until its alignment with the reticle is such that any alignment errors are minimized or are within specification.

Continuing, however, certain films on the wafer substrate can have low reflectance at the wavelength of the laser used for alignment. For example, in some embodiments, an He—Ne laser emitting a wavelength of about 632.8 nm (red light) is used for performing alignment (although other wavelengths can also be used). However, with a single gallium nitride (GaN) film, interference effects result in a reflectance of only 12%, and the reflectance range is about 31% at this wavelength. The reflectance is also sensitive to the thickness of the GaN film and deviations in the wavelength (due to constructive and destructive interference). Similarly low reflectance can also occur on other films besides GaN, for example films formed from an alloy of aluminum (Al), gallium (Ga), nitrogen (N), and indium (In). By way of comparison, the reflectance of 632.8 nm light off a bare silicon substrate is about 34.8%. This weak reflectance and unstable light signal from a low-reflectance film such as GaN can cause lithography tool alarms and fails on the alignment process, which reduces throughput as the production line is shut down while the alarms are investigated.

The present disclosure describes methods for increasing the reflectance of an alignment mark. Very generally, a relatively high-reflectance film is deposited on the alignment mark formed on a relatively low-reflectance substrate. The reflectance of the two films is defined relative to each other—one will always be higher and one will always be lower. Desirably, however, the difference in reflectance between the high-reflectance film and the low-reflectance substrate is at least 10% at a given wavelength.

As used herein, the term "reflectance" refers to the amount of reflected radiation divided by the amount of incident radiation for a given wavelength, and is measured in percentage from 0% to 100%. The reflectance may be a combination of specular and/or diffuse reflectance. Desirably, reflectance is as high as possible.

Continuing, thin-film interference is a natural phenomenon in which light waves (e.g. from a laser or other light source) reflected by the upper and lower boundaries of a thin film interfere with one another, resulting in either constructive interference or destructive interference, depending on the given wavelength of the laser. This phenomenon results in the reflectance having a sinusoidal shape. There will thus be a maximum reflectance that occurs at a wavelength on one side of the given wavelength, and a minimum reflectance that occurs at a wavelength on the other side of the given wavelength. The term "reflectance range" refers to the difference between the maximum reflectance and the minimum reflectance for the given wavelength. Desirably, the reflectance range is as small as possible.

Figure 2:
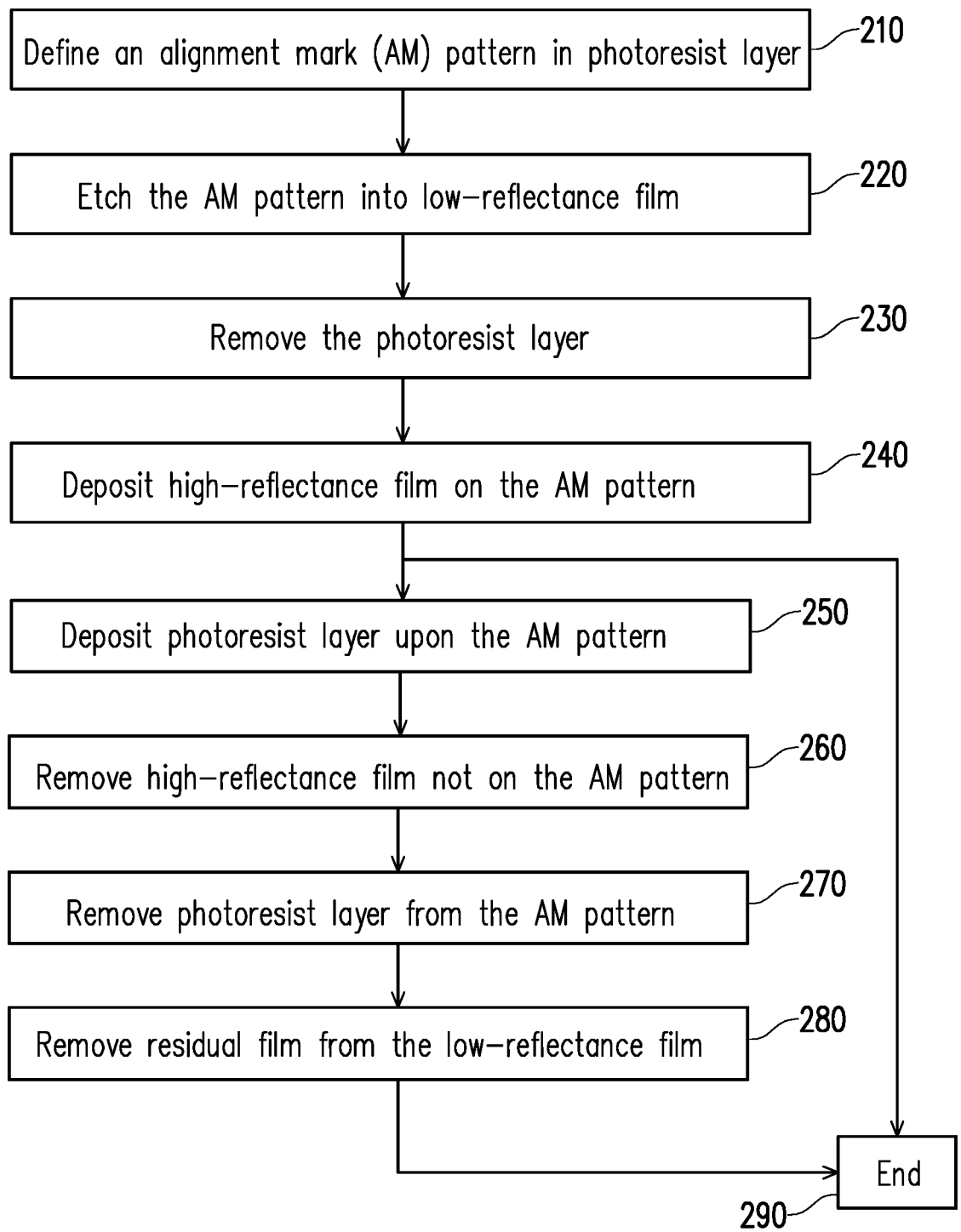
FIG. 2 is a flowchart illustrating a method for increasing the reflectance of an alignment mark, in accordance with some embodiments.

FIG. 2 is a flowchart illustrating two such methods, in accordance with some embodiments. The first method includes steps 210, 220, 230, 240, 250, 260, 270, 280, and 290, and is illustrated in FIGS. 3A-3H. The second method includes steps 210, 220, 230, 240, and 290, and is illustrated in FIGS. 3A-3C and FIG. 3I.

In the first method, starting with step 210, an alignment mark (AM) pattern is defined in a photoresist (PR) layer upon a low-reflectance film which is located on a substrate. In step 220, the AM pattern is etched into the low-reflectance film. In step 230, the PR layer is removed.

In step 240, a high-reflectance film is deposited upon the low-reflectance film which contains the AM pattern. In some embodiments, the high-reflectance film is deposited as a layer upon the low-reflectance film, and then etched. In such embodiments, the method continues with step 250, where a new or second PR layer is deposited on the AM pattern (and not on the remainder of the high-reflectance film). In step 260, the high-reflectance film is then etched to remove the portions of the high-reflectance film which are not located on the AM pattern (and which thus are not protected by the photoresist). It is noted that a residual film may be formed on the non-AM portion of the low-reflectance film, due to the reaction of the etchant with the low-reflectance film. In step 270, the photoresist on the AM pattern is removed. In step 280, the residual film is removed using an etchant that is more selective for the residual film than the high-reflectance film. The method then ends at step 290.

The second method shares method steps 210, 220, and 230 in common with the first method. In the second method, in step 240, the high-reflectance film is deposited only upon the AM pattern, and not on the remainder of the low-reflectance film. In these embodiments, then, this second method ends, and goes directly to step 290.

Figure 3A:
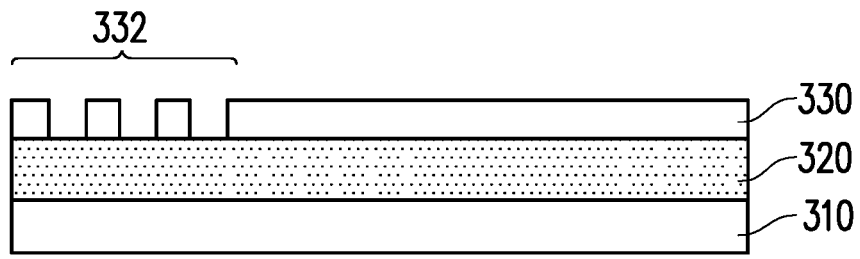
FIG. 3A is an illustration of one method step, in accordance with some embodiments. An alignment mark (AM) pattern is formed in a photoresist layer.
Figure 3B:
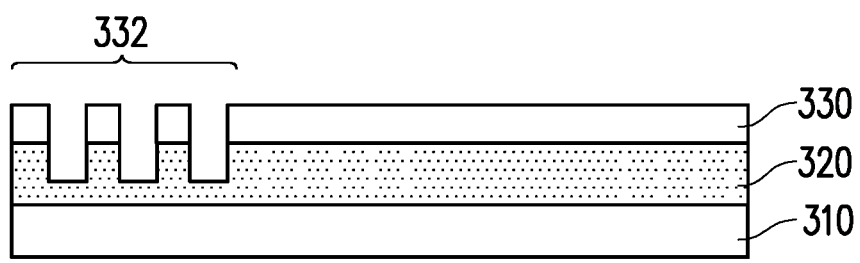
FIG. 3B is an illustration of another method step, in accordance with some embodiments. The AM pattern is etched into a low-reflectance film layer below the photoresist layer.
Figure 3C:
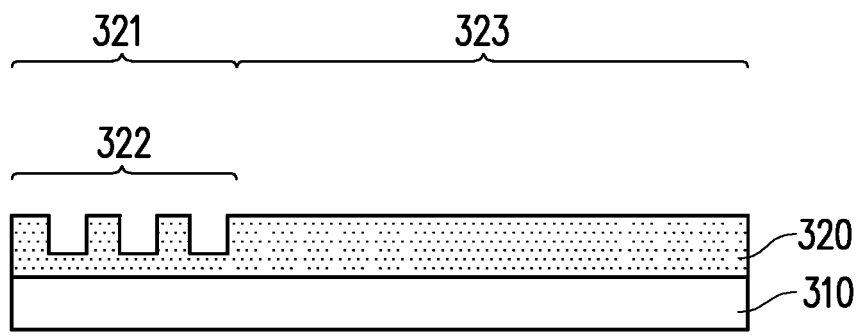
FIG. 3C is an illustration of another method step, in accordance with some embodiments. The photoresist layer is removed.
Figure 3D:
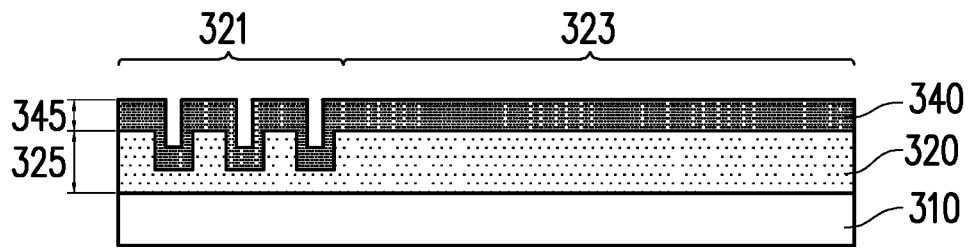
FIG. 3D is an illustration of another method step, in accordance with some embodiments. A high-reflectance film layer is deposited upon the low-reflectance film layer.
Figure 3E:
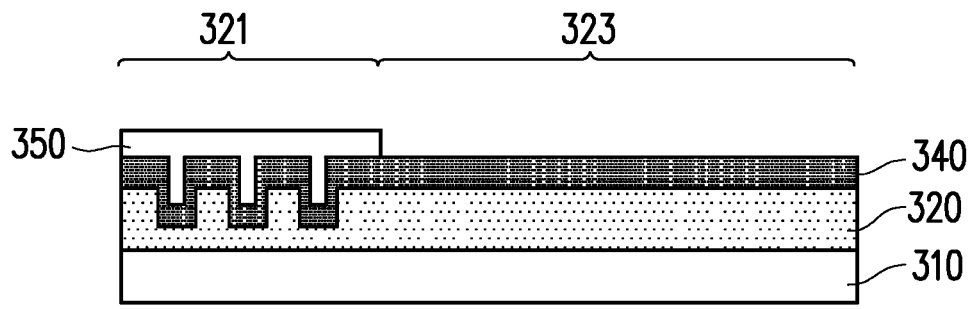
FIG. 3E is an illustration of another method step, in accordance with some embodiments. A second photoresist layer is deposited upon the portion of the high-reflectance film located on the AM pattern.
Figure 3F:
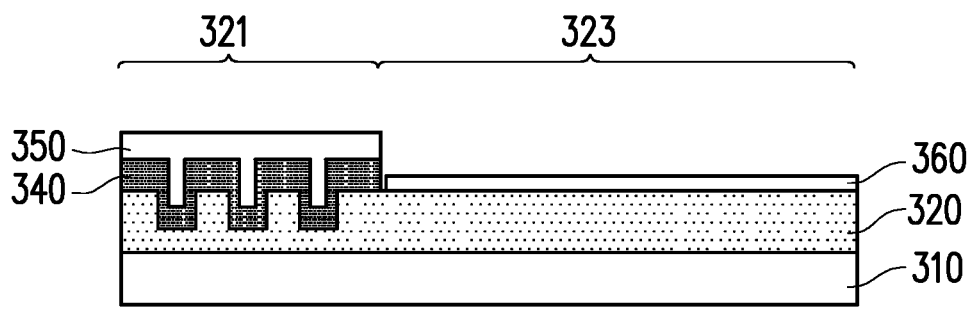
FIG. 3F is an illustration of another method step, in accordance with some embodiments. The exposed portion of the high-reflectance film layer is removed.
Figure 3G:
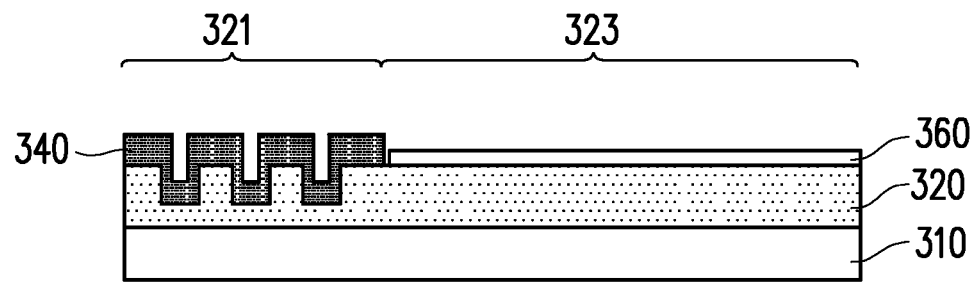
FIG. 3G is an illustration of another method step, in accordance with some embodiments. The second photoresist layer is removed.
Figure 3H:
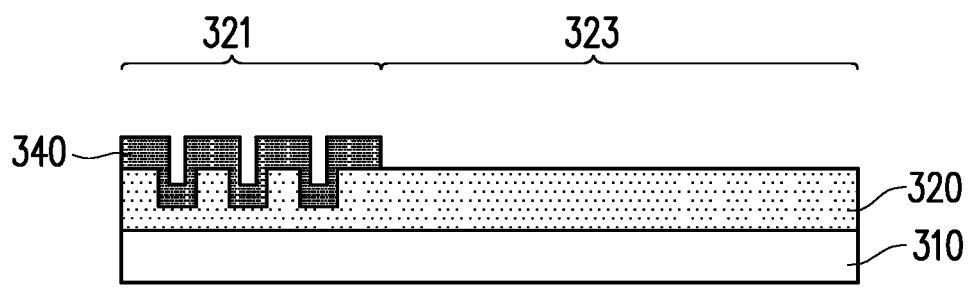
FIG. 3H is an illustration of another method step, in accordance with some embodiments. Any residual film is removed from the low-reflectance film layer.
Figure 3I:
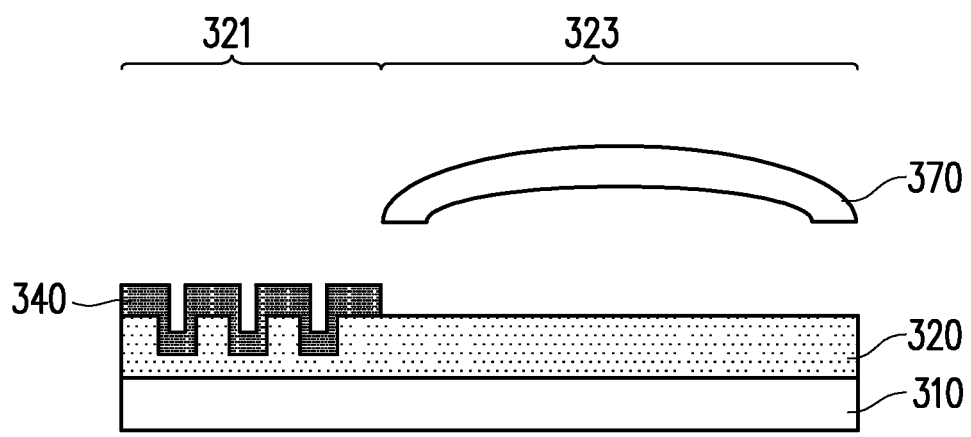
FIG. 3I is an illustration of a separate method step which can follow FIG. 3C, in accordance with some embodiments. A shield is used to control deposition of the high-reflectance film layer upon desired locations in the low-reflectance film layer.

FIGS. 3A-3I illustrate the various steps of FIG. 2, and the two methods described therein. FIGS. 3A-3H illustrate the first method where the high-reflectance film is deposited as a layer upon the low-reflectance film, and then etched. FIG. 3I illustrates the second method where the high-reflectance film is deposited only upon the AM pattern, and not on the remainder of the low-reflectance film.

With respect to the first method, FIG. 3A shows a low-reflectance film layer 320 located upon a semiconductor wafer substrate 310. For example, the substrate may be silicon and the low-reflectance film may be formed from gallium nitride (GaN), in accordance with some embodiments, although they may also be any other suitable material. The low-reflectance film may be formed, for example, by chemical vapor deposition (CVD) or by sputtering, or any other appropriate process.

A photoresist (PR) layer 330 is located upon the low-reflectance film layer. The PR layer is typically deposited using spin-coating, though other methods known in the art can also be used. An alignment mark (AM) pattern 332 is present in the PR layer, and is illustrated here as three trenches, although any other pattern can also be used. The AM pattern can be formed in the PR layer using known processes such as patterning via photolithography and subsequent development of the PR layer. This figure corresponds to method step 210 in FIG. 2.

In FIG. 3B, the three-trench AM pattern 332 in the PR layer is etched into the low-reflectance film layer 320. This can be done using known processes such as wet etching or dry etching, as appropriate. This figure corresponds to method step 220 in FIG. 2.

In FIG. 3C, the PR layer is removed. The AM pattern 322 is present in the low-reflectance film layer. The low-reflectance film layer 320 can be divided into an AM portion 321 and a non-AM portion 323. The AM portion 321 contains the AM pattern 322, and the non-AM portion 323 does not contain the AM pattern. These portions are so designated only for explanation. It should be understood that additional AM patterns may also be present elsewhere on the low-reflectance film layer 320, and those additional AM patterns may be considered as being in the AM portion or the non-AM portion, depending on whether it is desired to practice the methods of the present disclosure on those additional AM patterns concurrently or not. This figure corresponds to method step 230 in FIG. 2.

FIG. 3D shows a high-reflectance film layer 340 deposited upon the low-reflectance film layer 320. As illustrated here, the high-reflectance film layer 340 is deposited upon both the AM portion 321 and the non-AM portion 323 of the low-reflectance film layer. In some embodiments, the high-reflectance film layer is formed from titanium nitride (TaN). The deposition is typically performed by sputtering of the high-reflectance material upon the low-reflectance film layer. It is noted that the trenches making up the AM pattern are not filled by the high-reflectance material, as the sputtering material does not flow. This figure corresponds to method step 240 in FIG. 2.

In some embodiments, the high-reflectance film layer 340 has a thickness 345 of at least 200 angstroms. In accordance with some other embodiments, the high-reflectance film layer has a thickness of from about 200 angstroms to about 1500 angstroms, or from about 200 angstroms to about 1000 angstroms, or from about 200 angstroms to about 800 angstroms. Below the thickness of about 200 angstroms, the reflectance of the high-reflectance film layer is below the reflectance of bare silicon (which is used as a baseline for measuring whether the reflectance of the low-reflectance layer is improved). Above the thickness of about 800 angstroms, although the reflectance will still be improved over that of the low-reflectance film, the reflectance is saturated and does not continue to increase with further thickness.

The high-reflectance film layer is usually thinner than the low-reflectance film layer. For purposes of comparison, the low-reflectance film layer may have a thickness 325 on the order of about 50 thousand angstroms, such as from about 10 thousand angstroms to about 100 thousand angstroms.

In FIG. 3E, a new or second PR layer 350 is deposited on the AM portion 321. The second PR layer may fill the trenches that make up the AM pattern. The second PR layer is not deposited on the non-AM portion 323, thus leaving that part of the high-reflectance film layer 340 exposed. This figure corresponds to method step 250 in FIG. 2.

In FIG. 3F, the exposed portion of the high-reflectance film layer 340 (i.e. located in the non-AM portion 323 of the low-reflectance film layer) is removed. In some embodiments, a strong oxidizer is used to remove the high-reflectance material, such as hydrogen peroxide ($H_2O_2$). Potentially other oxidizers such as hydrofluoric acid (HF), nitric acid ($HNO_3$), sulfuric acid ($H_2SO_4$), or ozone ($O_3$) could also be used. The strong oxidizer may also react with the low-reflectance film layer 320 once the high-reflectance film layer is removed, resulting in a residual film 360 in the non-AM portion 323. For example, a residual film of $GaO_x$ may be formed when the low-reflectance film layer is GaN. This figure corresponds to method step 260 in FIG. 2.

In FIG. 3G, the second PR layer 350 on the AM pattern is removed. As seen here, then, only the AM portion 321 of the low-reflectance film layer is now coated with the high-reflectance film layer. In addition, the residual layer 360 of $GaO_x$ is still present. This figure corresponds to method step 270 in FIG. 2.

In FIG. 3H, the residual film of $GaO_x$ has been removed. Generally, this removal is performed using an etchant that is more selective for the residual film than the high-reflectance film. In some embodiments, a strong base such as ammonium hydroxide ($NH_4OH$) is used to remove the residual film. Other strong bases suitable for use may include sodium hydroxide (NaOH) and tetramethylammonium hydroxide (TMAH), although any appropriate etchant can be used. Ideally, the etchant does not react with the high-reflectance film layer. This figure corresponds to method step 280 in FIG. 2.

The results of the first method can be seen by comparing FIG. 3H to FIG. 3C. The most significant difference between the two figures is the presence of the high-reflectance film layer 340 in the AM portion 321 of the low-reflectance film layer 320. In addition, the non-AM portion of the low-reflectance film layer may have a slightly reduced thickness in FIG. 3H, when compared to FIG. 3C. The reflectance of the AM pattern has thus been improved while the remainder of the low-reflectance film layer is available for subsequent processing.

The second method of FIG. 2 is illustrated moving from FIG. 3C to FIG. 3I. In FIG. 3I, the AM pattern 322 is present in the low-reflectance film layer. The high-reflectance film layer 340 is deposited only upon the AM portion 321 of the low-reflectance film layer 320. In this regard, as previously mentioned, the high-reflectance film layer is typically formed by sputtering. As illustrated here, the non-AM portion 323 of the low-reflectance film layer is covered by a shield 370, which prevents the sputtered material from being deposited in the non-AM portion. Put another way, the location at which the high-reflectance film is deposited can be controlled using the shield. The shield may be made in any desired shape, and can be made from suitable materials. The additional steps shown in FIGS. 3D-3H are not used in the second method.

Because subsequent etching and removal of the high-reflectance film is no longer needed in the non-AM region, it is possible for additional materials (which may be difficult to etch and remove) to form the high-reflectance film layer when using the second method. For example, besides titanium nitride (TaN), the high-reflectance film could be made from copper (Cu) or aluminum (Al). Cu and Al are relatively difficult to etch compared to TaN, but can be used to increase reflectance if etching is not necessary. The thickness of the high-reflectance film layer 340 when using the second method is contemplated to be the same as described above with respect to the first method. This does not change due to the use of the second method instead of the first method.

Comparing FIG. 3I to FIG. 3C, again, the most significant difference is the presence of the high-reflectance film layer 340 in the AM portion 321 of the low-reflectance film layer 320. When comparing FIG. 3I to FIG. 3H, it is noted that the thickness of the non-AM portion of the low-reflectance film layer is not changed in FIG. 3I, whereas the thickness may be slightly reduced thickness in FIG. 3H.

The two methods of FIG. 2 are illustrated in FIGS. 3A-3I as being performed on a low-reflectance film layer located directly on a wafer substrate. More generally, though, these methods can be used to increase the reflectance of any alignment mark (AM) pattern in a low-reflectance film in any location of a stack of layers upon the wafer substrate. Thus, the low-reflectance film itself can also be considered a low-reflectance substrate upon which the high-reflectance film is deposited.

Use of the high-reflectance film layer on the AM pattern can significantly increase the reflectance, reducing variation in the light signal. For example, in some embodiments, the reflectance is increased from a value of about 12% to a range of about 32.5% to about 60%. In addition, the reflectance range is improved from a high value of about 31% to a range of from about 21% to less than 1%.

The stronger and more stable light signal provided by the high-reflectance film layer reduces "false" lithography tool alarms and fails on the alignment process, which increases device throughput. The methods of the present disclosure may be especially useful for transistors and other similar devices made using GaN, by increasing the reflectance of the alignment marks made with GaN.

The present disclosure is contemplated to be useful for multiple different photolithography processes, including those that use different operating light wavelengths. For example, the present methods and structures can be used on wafer substrates during g-line lithography (436 nm), h-line lithography (405 nm), i-line lithography (365 nm), or DUV processes using KrF (248 nm) or ArF (193 nm) lasers. They are also useful with extreme ultraviolet (EUV) processes, which span wavelengths from 124 nanometers (nm) down to 10 nm, and are currently being used to provide small minimum feature sizes.

The methods of the present disclosure may be used to improve the reflectance of an alignment mark. FIGS. 4A-4H illustrate some different alignment mark designs in plan view (though the present disclosure is not limited to only these designs). In these illustrations, the bottoms of the trenches are shown in dark line, with the areas/widths between trenches remaining in white. A trench ratio can be defined as the sum of the areas between trenches (i.e. top area) divided by the sum of the bottom areas of the trenches (i.e. bottom area). Different designs can be useful for different applications which may depend on the tooling used, the location of the AM pattern, existing structures surrounding the alignment mark, structures desired to be formed in a particular layer, desired form of the alignment signal, etc.

Figure 4A:
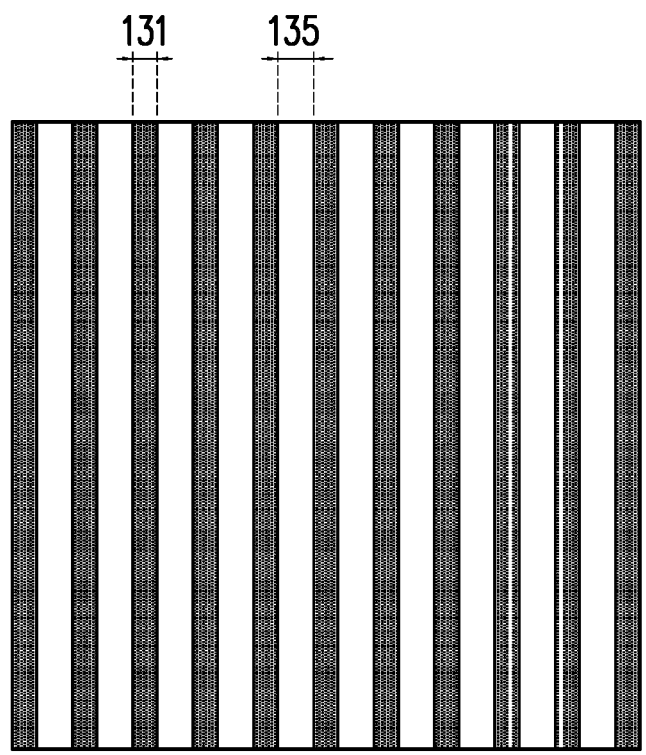
FIG. 4A is an illustration of an alignment mark design or pattern, in accordance with some embodiments.
Figure 4B:
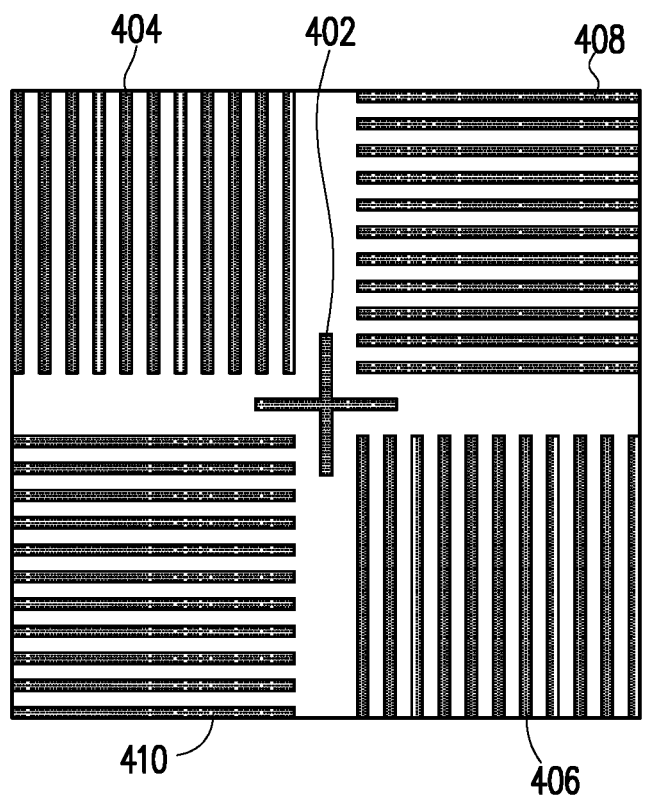
FIG. 4B is an illustration of another alignment mark design or pattern, in accordance with some embodiments.
Figure 4C:
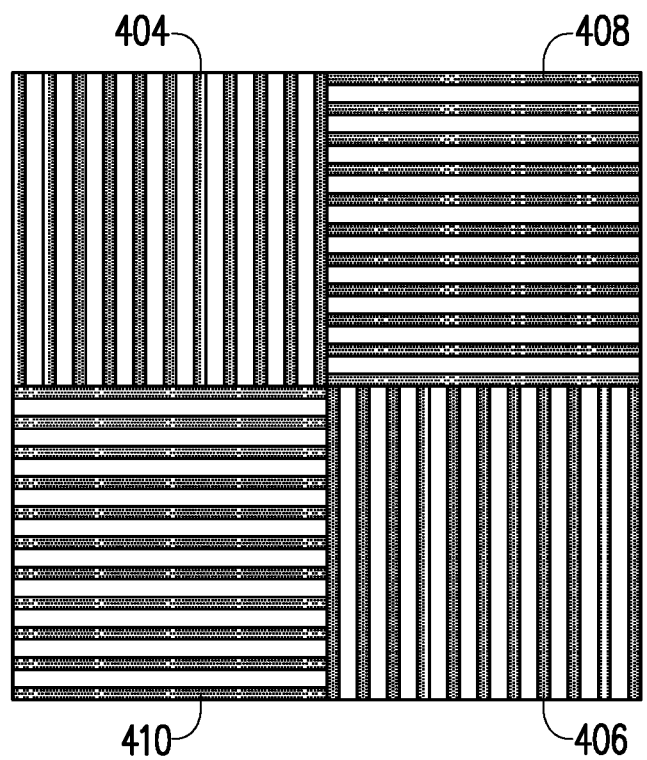
FIG. 4C is an illustration of another alignment mark design or pattern, in accordance with some embodiments.

Initially, the designs of FIGS. 4A-4C can be described as being formed from a series of relatively long trenches or SLM, or strips.

The design of FIG. 4A is formed by a series of parallel trenches. The bottom width 131 of each trench remains constant, and the distance between adjacent trenches 135 also remains constant. The width 131 of each trench is identical to the distance between adjacent trenches 135. The trench ratio of this design is thus 1.00.

The design of FIG. 4B includes both horizontal trenches and vertical trenches. The center of the design includes a cross 402, formed by the intersection of a horizontal trench and a vertical trench. The top left quadrant 404 and the bottom right quadrant 406 are formed by a series of parallel vertical trenches. The top right quadrant 408 and the bottom left quadrant 410 are formed by a series of parallel horizontal trenches. Each quadrant is like that of FIG. 4A, with the width of each trench being the same as the distance between adjacent trenches. However, the top area between the four quadrants is much higher. Thus, the trench ratio of this design is about 1.16.

The design of FIG. 4C is like that of FIG. 4B, having four quadrants of parallel trenches 404, 406, 408, 410. However, this design does not include the cross in the center. Each quadrant is also like that of FIG. 4A, with the width of each trench being the same as the distance between adjacent trenches. The trench ratio of this design is about 1.00.

Figure 4D:
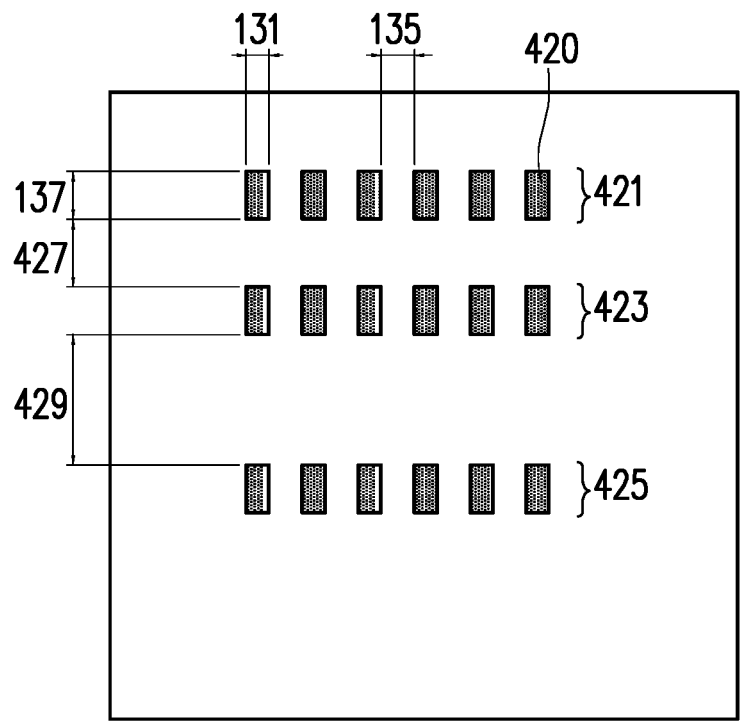
FIG. 4D is an illustration of another alignment mark design or pattern, in accordance with some embodiments.
Figure 4E:
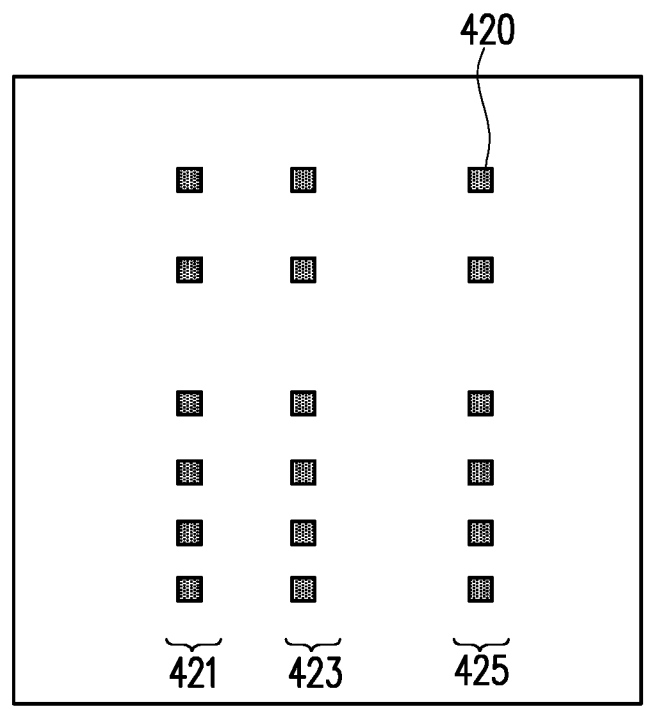
FIG. 4E is an illustration of another alignment mark design or pattern, in accordance with some embodiments.

In contrast, the designs of FIG. 4D and FIG. 4E are made from relatively short cells 420. A cell can be considered a trench of relatively short length, where the length 137 is about the same as the width 131.

The design of FIG. 4D is formed from cells where the ratio of length 137 to width 131 is about 2:1. Each cell is organized with the length extending vertically. The cells are then organized into three horizontal lines 421, 423, 425. In each horizontal line of cells, the distance between adjacent cells 135 is constant, with the distance between adjacent cells 135 being greater than the width 131 of the cells. The distance 427 between the first horizontal line 421 and the second horizontal line 423 is about half the distance 429 between the second horizontal line 423 and the third horizontal line 425. The trench ratio of this design is about 11.5.

The design of FIG. 4E is formed from cells 420 where the ratio of length to width is about 1:1. This design is like FIG. 4D, except with the three lines 421, 423, 425 being organized vertically. The trench ratio of this design is about 20.8.

Figure 4F:
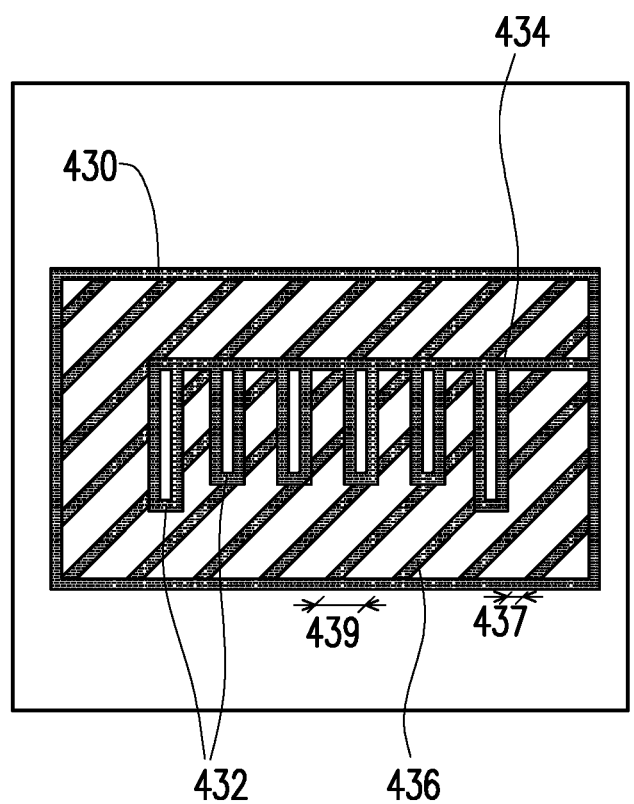
FIG. 4F is an illustration of another alignment mark design or pattern, in accordance with some embodiments.

The design of FIG. 4F includes four trenches arranged on an outside perimeter 430 to form a rectangular interior area. Six additional rectangular areas 432 are defined near the center of the interior area. A horizontal trench 434 joins the six rectangular areas to the outside perimeter. A series of diagonal trenches 436 fills the remainder of the interior area. The distance 439 between adjacent diagonal trenches is much greater than the width 437 of each diagonal trench. The trench ratio of this design is about 23.6.

Figure 4G:
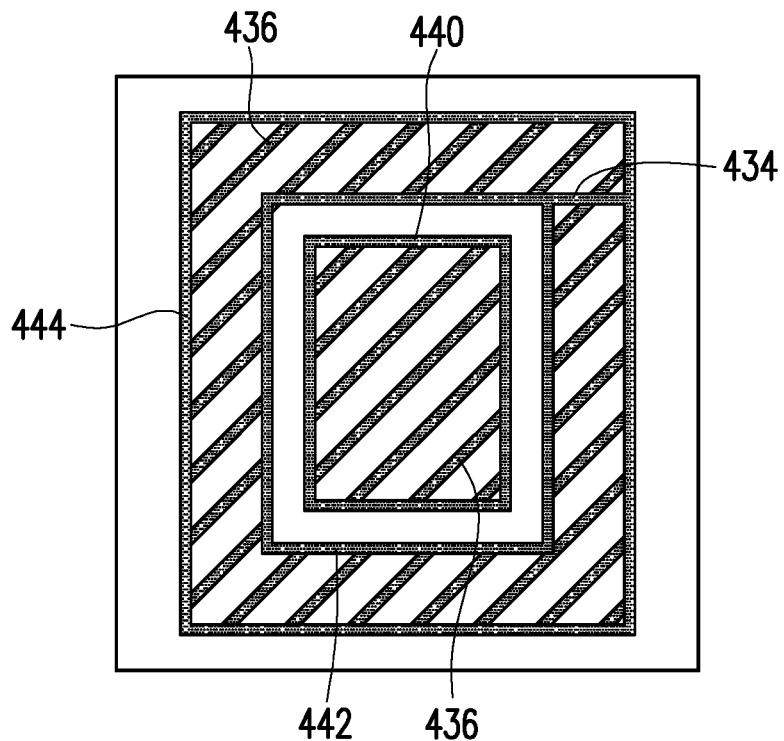
FIG. 4G is an illustration of another alignment mark design or pattern, in accordance with some embodiments.

The design of FIG. 4G can be described as including three rectangular perimeters 440, 442, 444 arranged about a common center. The area of the inner-most rectangle 440 is filled with diagonal trenches 436. The distance between adjacent diagonal trenches is much greater than the width of each trench. The annular area formed between the inner-most rectangle 440 and the middle rectangle 442 does not contain any diagonal trenches, or in other words is all top area. The next annular area formed between the middle rectangle 442 and the outer-most rectangle 444 is also filled with diagonal trenches 436. Again, the distance between adjacent diagonal trenches is much greater than the width of each trench. A horizontal trench 434 joins the middle rectangle to the outer-most rectangle (this is needed for the structure on the reticle). The trench ratio of this design is about 11.5.

Figure 4H:
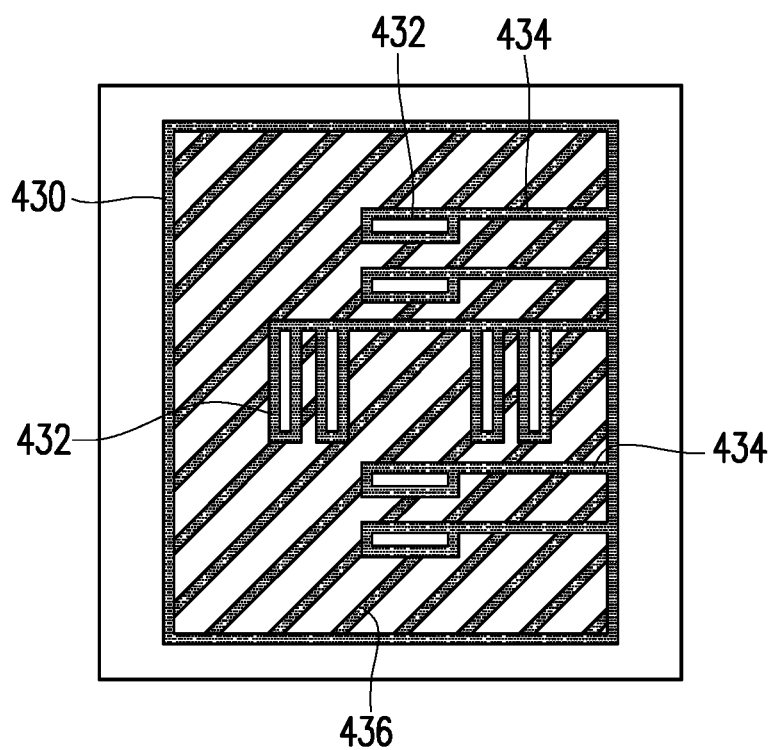
FIG. 4H is an illustration of another alignment mark design or pattern, in accordance with some embodiments.

The design of FIG. 4H includes an outer rectangle perimeter 430. Four horizontal rectangles 432 and four vertical rectangles 432 are located around a central area, two rectangles being located on each side around the central area. Diagonal trenches 436 fill the remainder of the interior area. The distance between adjacent diagonal trenches is much greater than the width of each trench. Five horizontal trenches 434 join the eight interior rectangles to the outer rectangle perimeter (again, this is needed for the structure on the reticle). The trench ratio of this design is about 8.06.

The methods of the present disclosure are contemplated to be effective on any alignment mark design, including those illustrated in FIGS. 4A-4H. In accordance with some embodiments of the present disclosure, the alignment mark may have a trench ratio (trench top area divided by trench bottom area) of about 0.8 to about 30, although other ratios are also contemplated. This trench ratio can be measured either before or after the high-reflectance film layer is deposited.

In addition, the methods of the present disclosure are described with reference to the alignment being performed using an He—Ne laser emitting a wavelength of about 632.8 nm. However, the methods are also broadly applicable to light of any wavelength being used for alignment purposes.

The present disclosure thus relates to methods for increasing reflectance of an alignment mark in a photolithographic process. The alignment mark is defined in a photoresist layer which is over a low-reflectance substrate. The alignment mark is then etched into the low-reflectance substrate, and the photoresist layer is removed. A high-reflectance film is then deposited on the low-reflectance substrate that contains the alignment mark. Depending on whether the high-reflectance film is deposited only upon the alignment mark or also upon other portions of the low-reflectance substrate, the methods may also include steps for removing the high-reflectance film from those other portions of the low-reflectance substrate.

The present disclosure also relates to methods for increasing reflectance of an alignment mark during production of an integrated circuit. For example, a high-reflectance material is deposited to form a layer on a GaN film that contains the alignment mark. Photoresist is then deposited on a portion of the high-reflectance layer on the alignment mark, leaving exposed a remaining portion of the high-reflectance layer. The exposed portion of the high-reflectance layer is then removed from the GaN film. The photoresist is then removed to expose the portion of the high-reflectance layer on the alignment mark. Finally, any non-GaN material is removed from the GaN film.

The present disclosure also relates to an alignment mark on a low-reflectance substrate located upon a semiconducting wafer substrate, in accordance with various embodiments. The alignment mark comprises a plurality of trenches in the low-reflectance substrate and a high-reflectance film deposited upon the plurality of trenches.

The present disclosure is further illustrated in the following non-limiting working examples, it being understood that these examples are intended to be illustrative only and that the disclosure is not intended to be limited to the materials, conditions, process parameters and the like recited herein.

EXAMPLES

A number of simulated structures were made using FILMETRICS. In the simulated structures, a silicon substrate was coated with a GaN layer having a thickness of 50 thousand angstroms. An alignment mark pattern was formed in the GaN layer, and the alignment mark was then coated with a TiN layer having a different thickness ranging from zero to 1500 angstroms. The reflectance of the resulting simulated structure was calculated.

Figure 5:
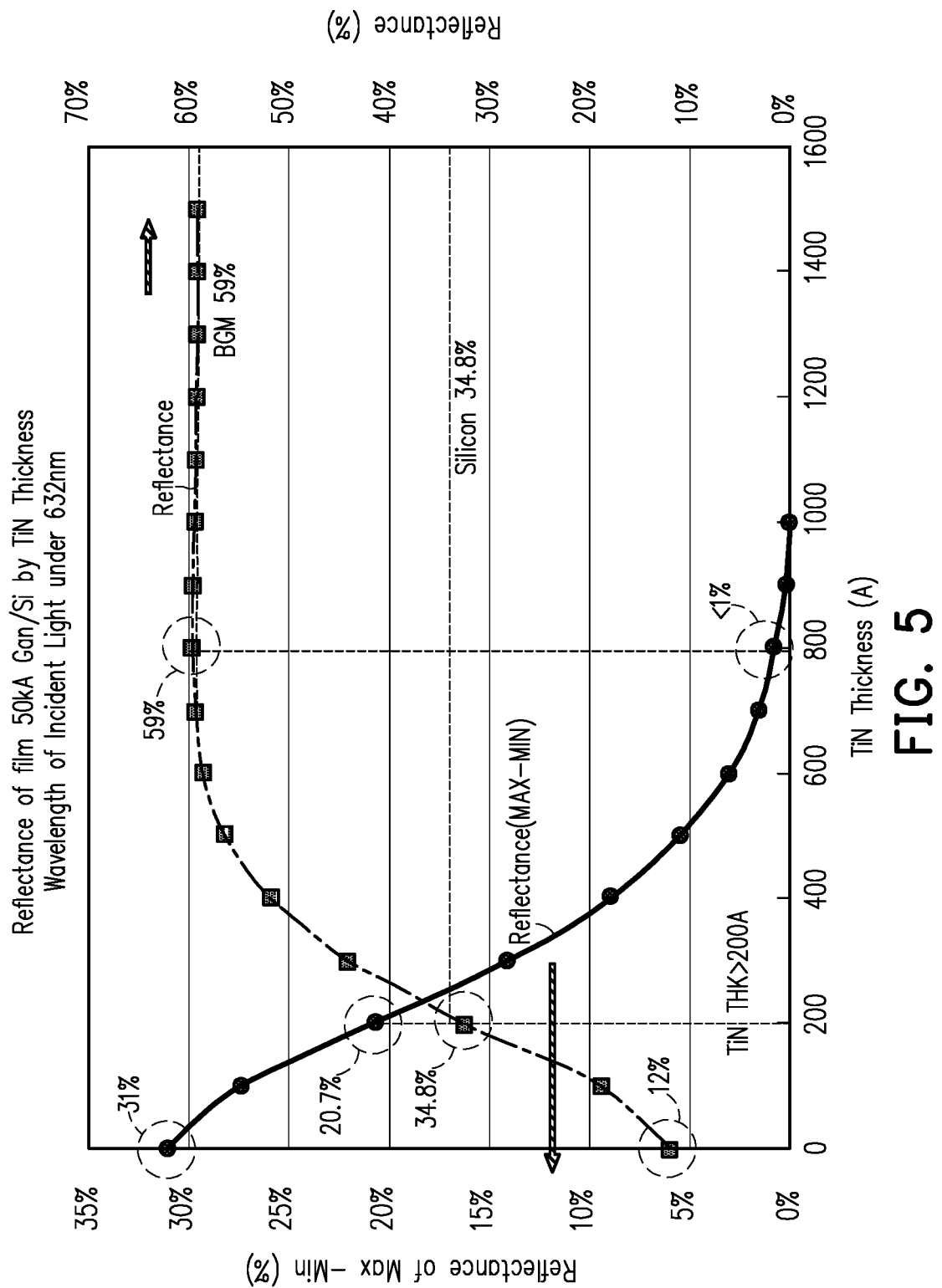
FIG. 5 is a graph showing the results of the measurements at a wavelength of about 632 nm. The left-hand y-axis of the graph is the reflectance range (max-min), and ranges from 0% to 35% in intervals of 5%. The right-hand y-axis of the graph is the reflectance, and ranges from 0% to 70% in intervals of 10%. The x-axis is the thickness of the TiN layer, and ranges from zero to 1600 angstroms in intervals of 200 angstroms.

FIG. 5 is a graph summarizing the results of the reflectance calculations at a wavelength of about 632 nm as the TiN thickness increased. The reflectance range started at a value of 31% at zero angstroms and decreased to a value of less than 1 by 800 angstroms. The reflectance began at a value of 12% at zero angstroms and increased to 59% by 800 angstroms. A horizontal line at 34.8% indicates the reflectance of bare silicon. A vertical line at about 200 angstroms indicates the TiN thickness at which the reflectance is about equal to that of bare silicon.

In this regard, there are two different baselines used for comparison to determine the improvement using the TiN layer. The first baseline is bare silicon, and the second baseline is GaN. Desirably, the reflectance of the TiN layer is higher than that of bare silicon, and the reflectance range of the TiN layer is lower than that of GaN.

Figure 6:
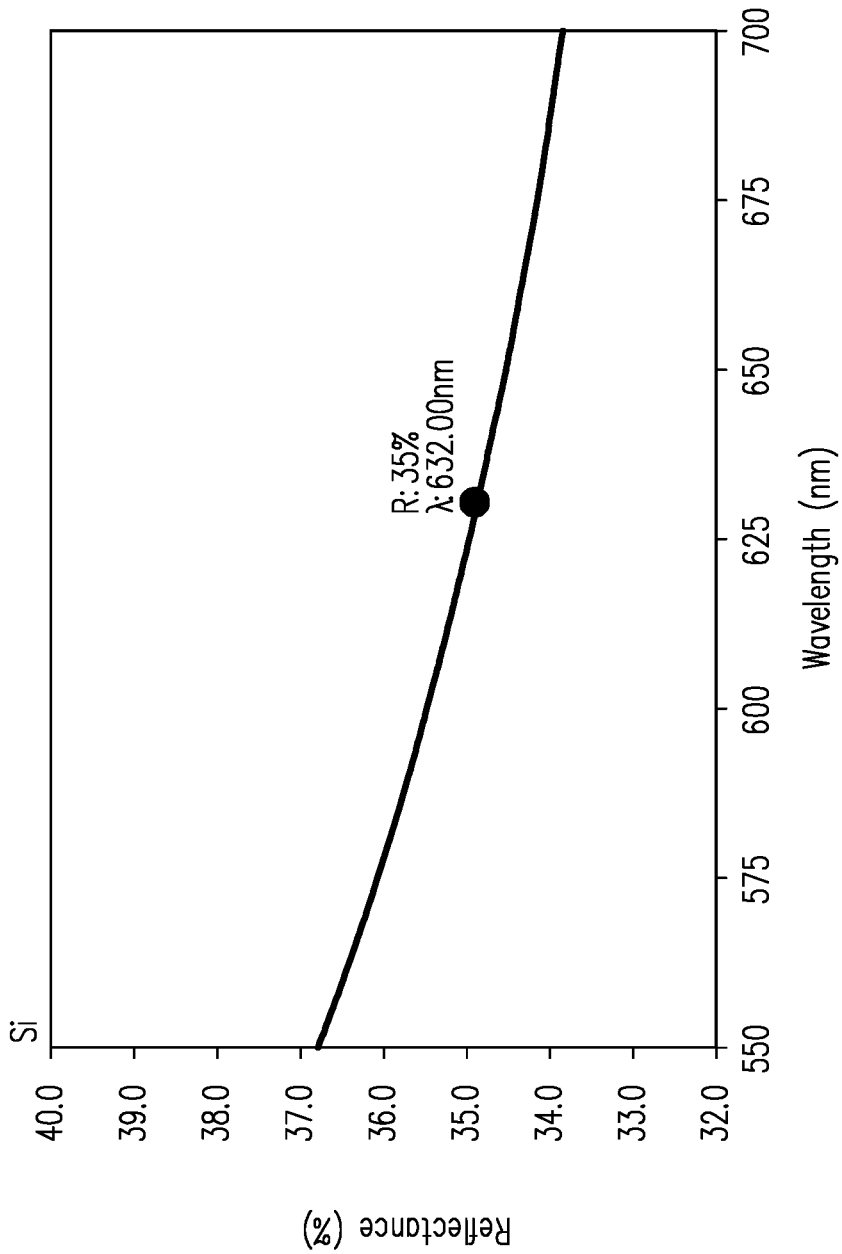
FIG. 6 is a graph showing reflectance vs. wavelength for bare silicon.
Figure 7:
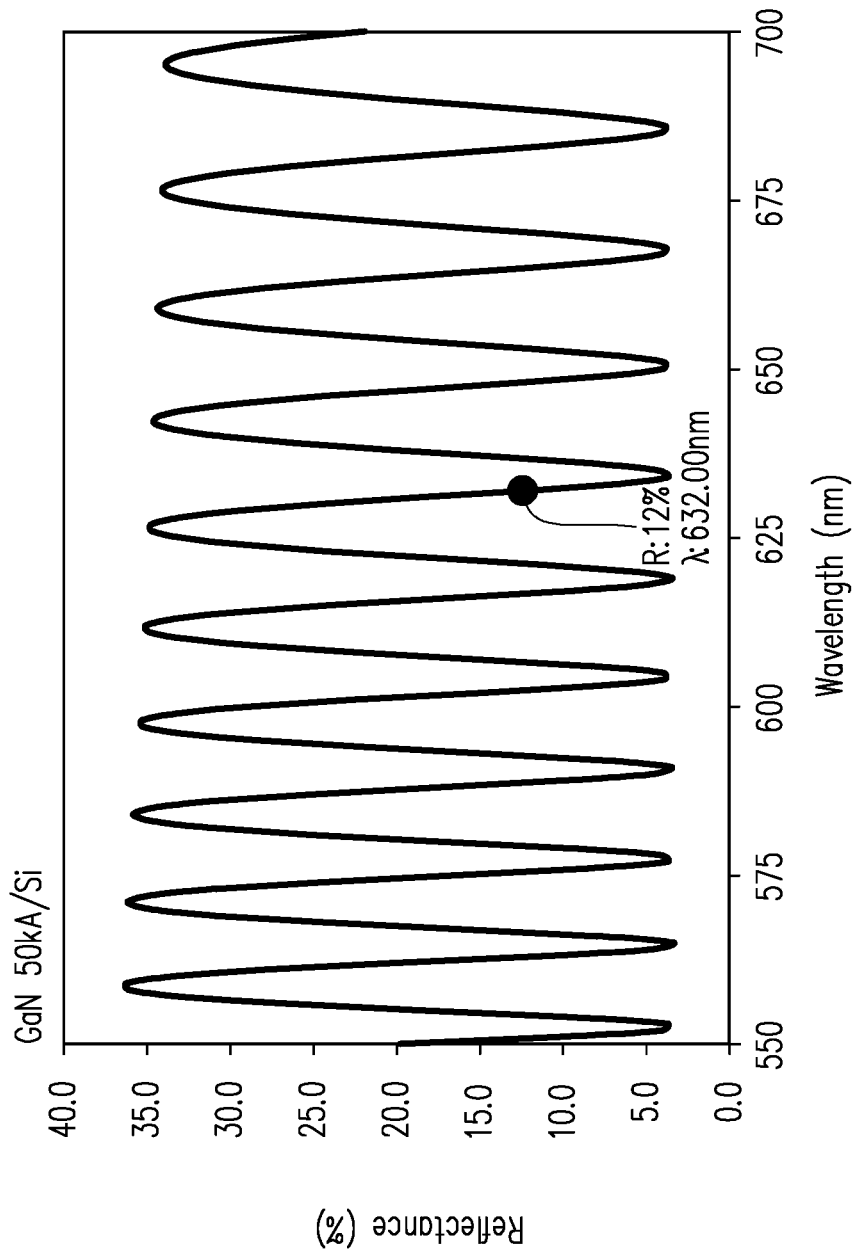
FIG. 7 is a graph showing reflectance vs. wavelength for a GaN layer having a thickness of 50 thousand angstroms.

For comparative purposes, FIG. 6 is a graph showing reflectance versus wavelength for bare silicon. At about 632 nm, the reflectance was 35%. Also for comparative purposes, FIG. 7 is a graph showing reflectance versus wavelength for GaN with a thickness of 50 thousand angstroms, with no TiN layer. At about 632 nm, the reflectance was 12%, and the reflectance range was about 31.1%.

FIGS. 8-12 are graphs showing reflectance versus wavelength for a silicon substrate, a GaN layer with a thickness of 50 kiloangstroms, and a TiN layer of various thicknesses. Each graph indicates the reflectance at about 632 nm, and show the improvement in reflectance and reflectance range with the additional high-reflectance film layer.

Figure 8:
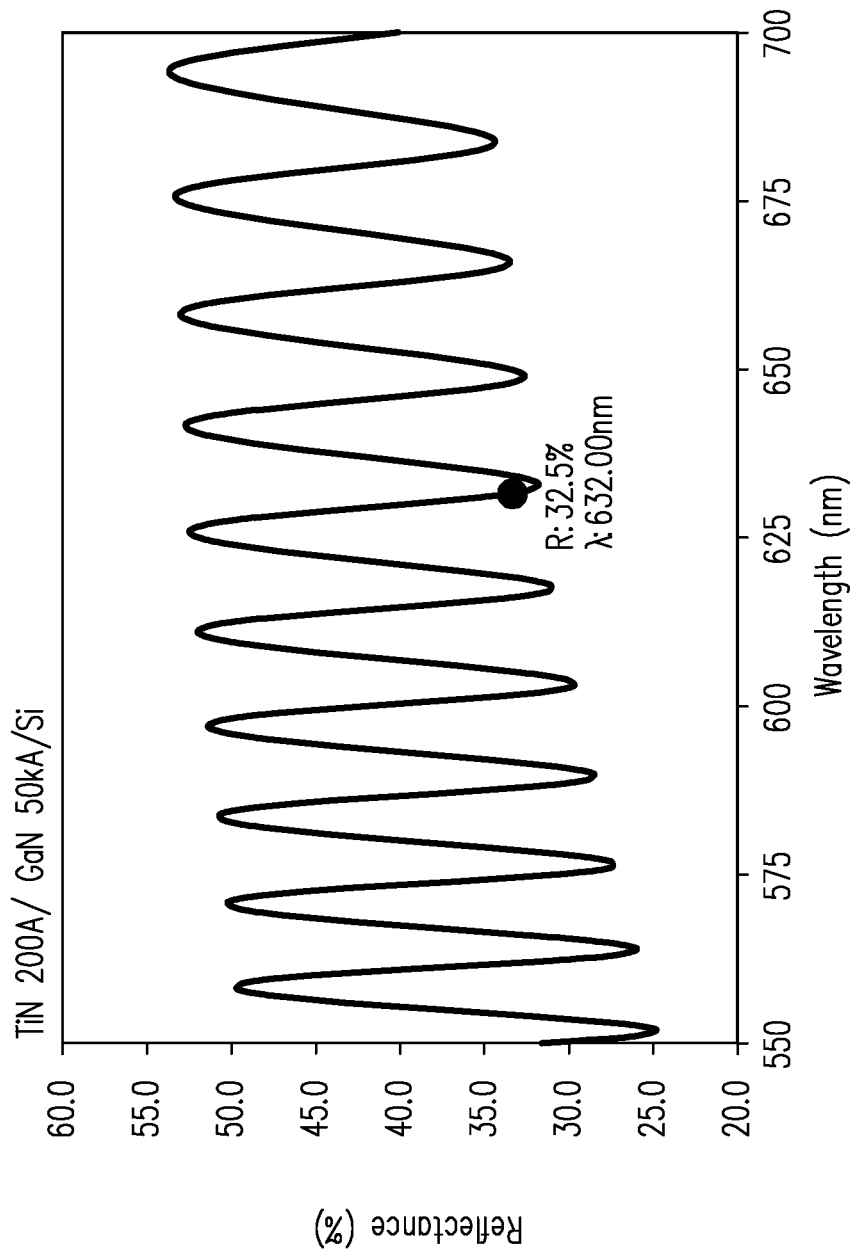
FIG. 8 is a graph showing reflectance vs. wavelength for a silicon substrate, a GaN layer (about 50 kA thick), and a TiN layer with a thickness of about 200 angstroms.

In FIG. 8, the reflectance of a TiN layer having a thickness of 200 angstroms was about 32.5%, and the reflectance range was about 20.7%. At this thickness, the reflectance was roughly equal to the 35% reflectance of bare silicon, and the reflectance range was lower than the 31.1% value for GaN.

Figure 9:
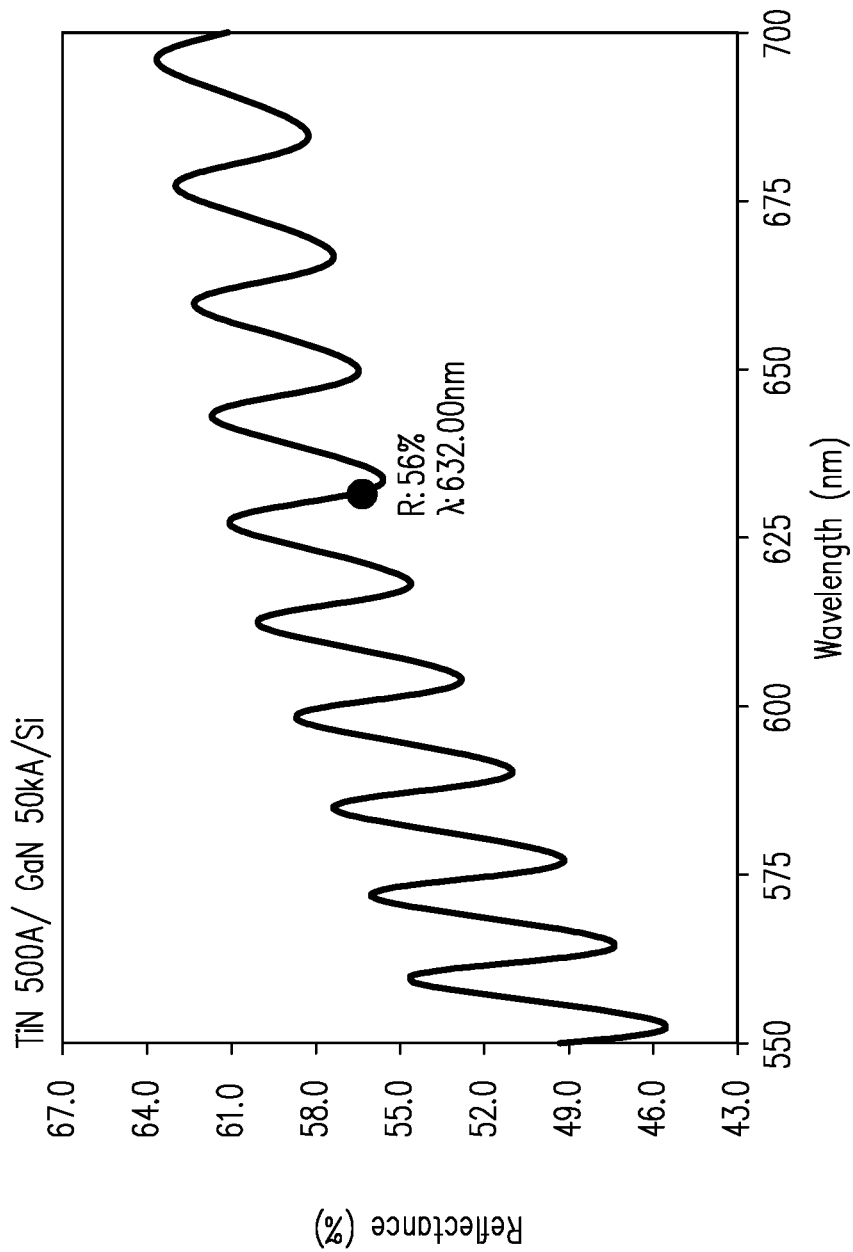
FIG. 9 is a graph showing reflectance vs. wavelength for a silicon substrate, a GaN layer (about 50 kA thick), and a TiN layer with a thickness of about 500 angstroms.

In FIG. 9, the reflectance of a TiN layer having a thickness of 500 angstroms was about 56%, and the reflectance range was about 5.4%. The reflectance continued to increase and the reflectance range continued to decrease at this greater TiN thickness.

Figure 10:
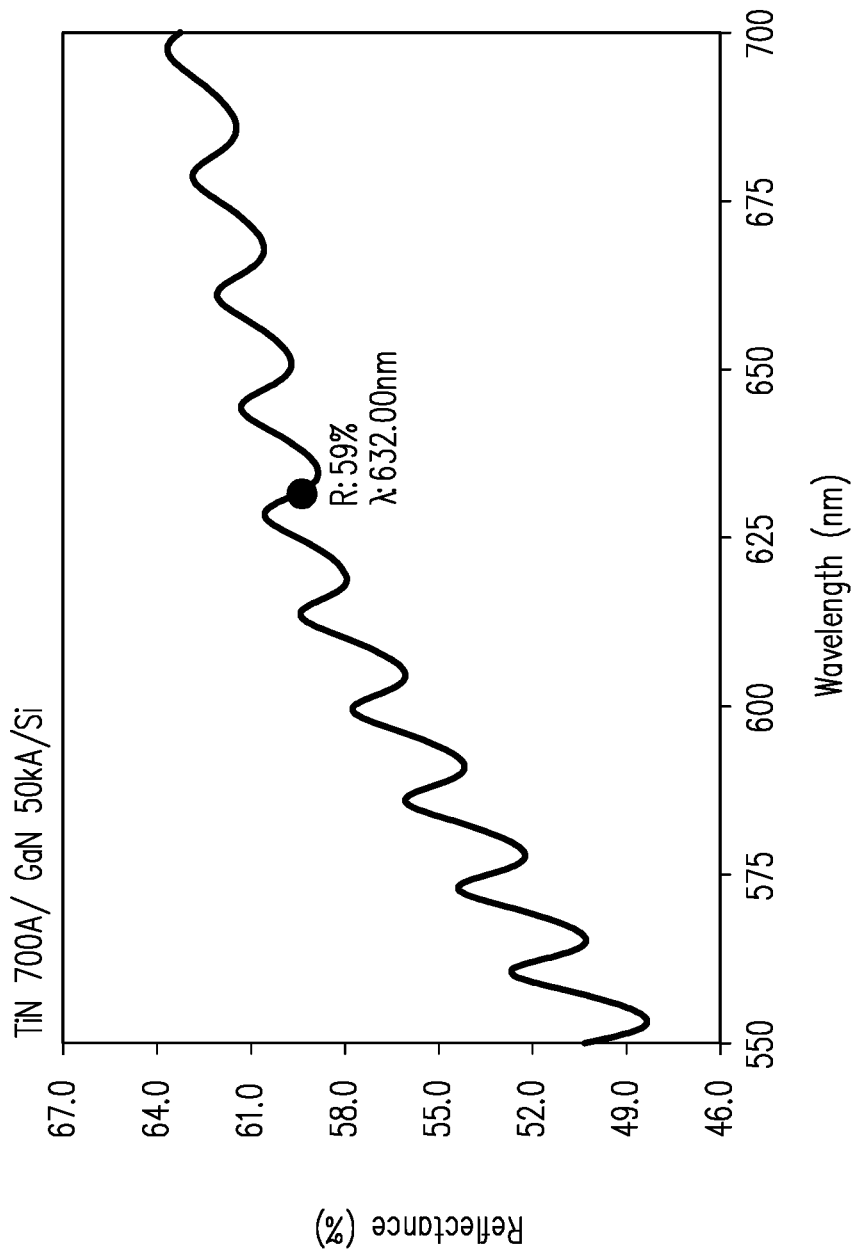
FIG. 10 is a graph showing reflectance vs. wavelength for a silicon substrate, a GaN layer (about 50 kA thick), and a TiN layer with a thickness of about 700 angstroms.

In FIG. 10, the reflectance of a TiN layer having a thickness of 700 angstroms was about 59%, and the reflectance range was about 1.7%. The reflectance continued to increase and the reflectance range continued to decrease, but at a slower rate.

Figure 11:
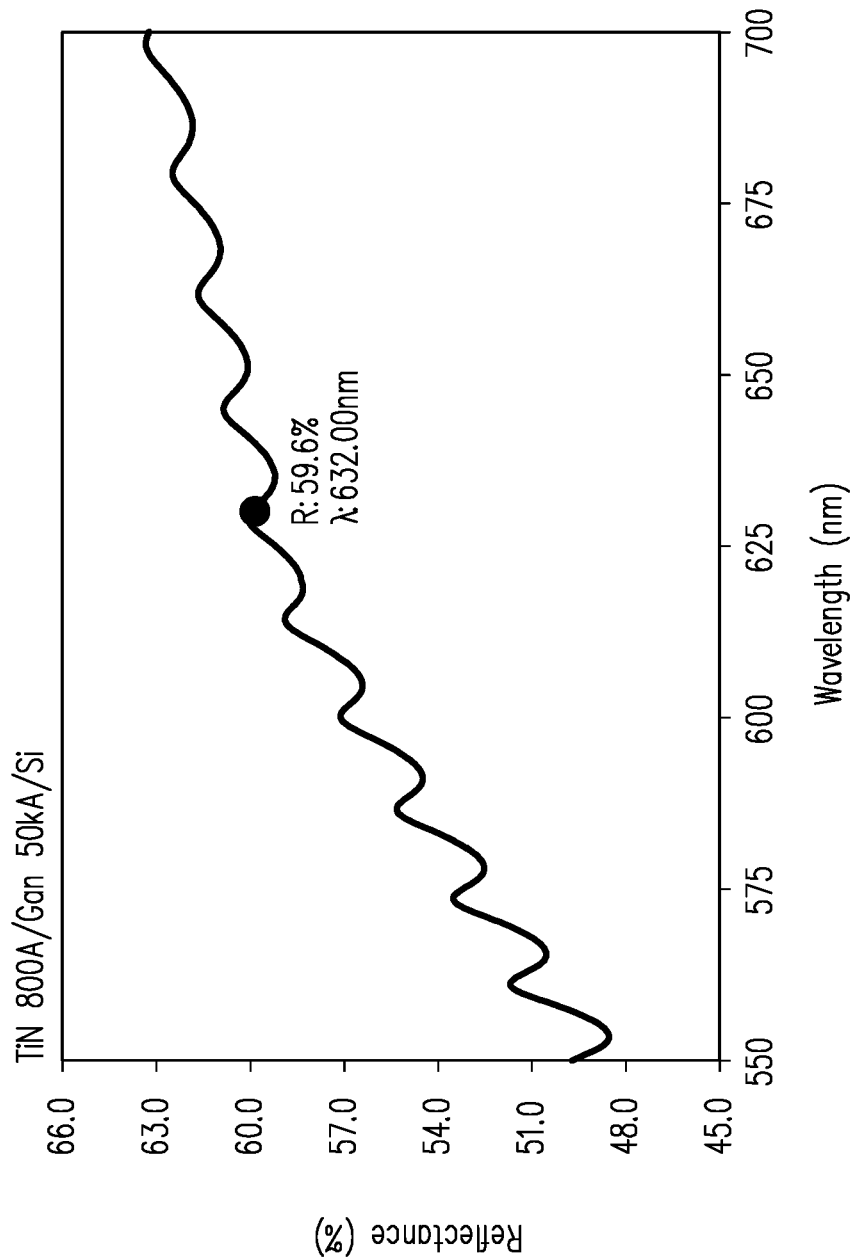
FIG. 11 is a graph showing reflectance vs. wavelength for a silicon substrate, a GaN layer (about 50 kA thick), and a TiN layer with a thickness of about 800 angstroms.

In FIG. 11, the reflectance of a TiN layer having a thickness of 800 angstroms was about 59.6%, and the reflectance range was about 0.9%. The rate of improvements in reflectance and reflectance range is decreasing.

Figure 12:
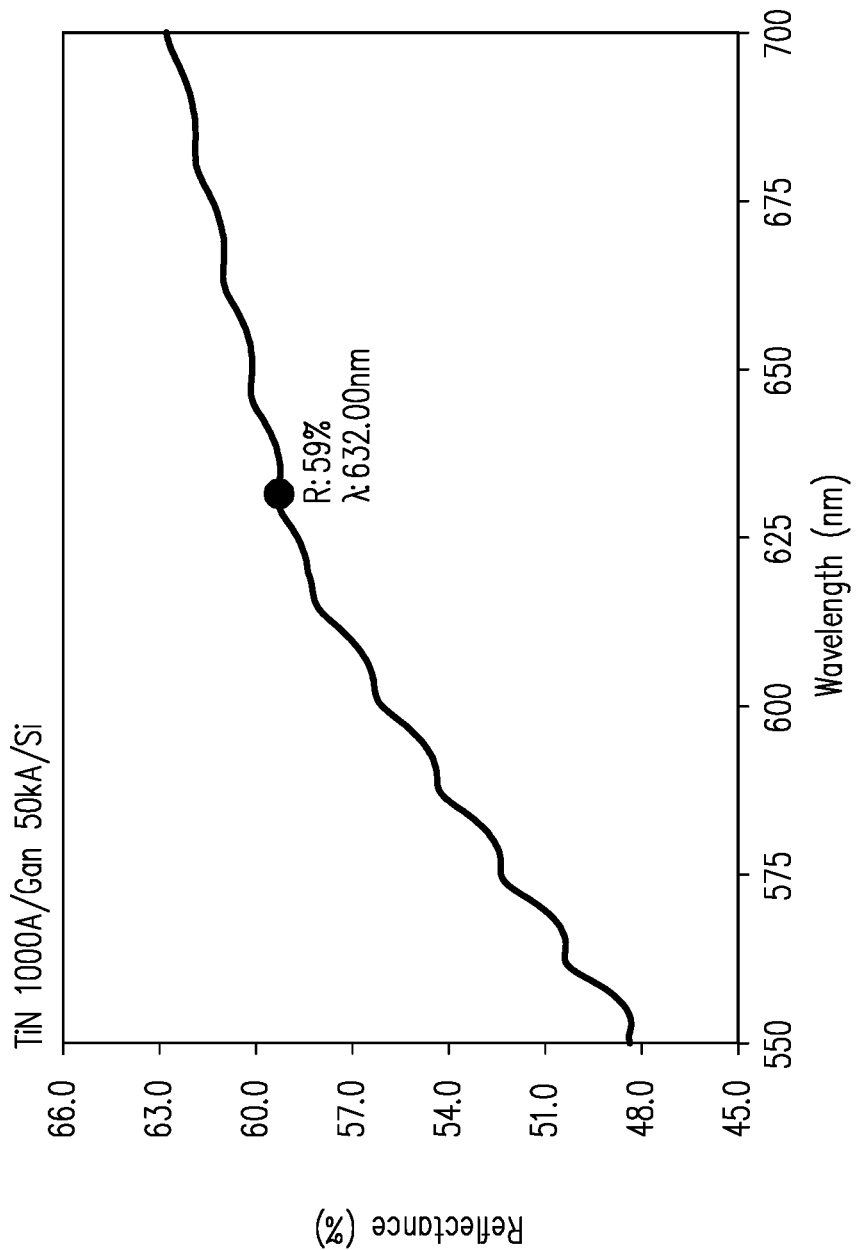
FIG. 12 is a graph showing reflectance vs. wavelength for a silicon substrate, a GaN layer (about 50 kA thick), and a TiN layer with a thickness of about 1000 angstroms.

In FIG. 12, the reflectance of a TiN layer having a thickness of 1000 angstroms was about 59%, and the reflectance range was about 0.1%. The improvement in reflectance and reflectance range appear to be saturated, or in other words are not continuing to increase with increased TiN thickness.

As can be seen from these figures, as the thickness of the TiN (i.e. high reflectance) layer increased from zero to a high value of about 800 angstroms to about 1000 angstroms, the reflectance also increased, eventually saturating at a value of about 59%. This value is very high, and will avoid alignment fails. The reflectance range also decreased, eventually becoming less than 1%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for increasing reflectance of an alignment mark in a photolithographic process, comprising:
   defining the alignment mark in a photoresist layer which is over a low-reflectance substrate;
   etching the alignment mark into the low-reflectance substrate;
   removing the photoresist layer; and
   depositing a high-reflectance film on the low-reflectance substrate that contains the alignment mark, the high-reflectance film having a higher reflectance than the low-reflectance substrate;
   wherein the alignment mark comprises a plurality of trenches, wherein a trench top area is a sum of areas between the trenches and a trench bottom area is a sum of bottom areas of the trenches, and the ratio of the trench top area to the trench bottom area after deposition of the high-reflectance film is from about 0.8 to about 30.

2. The method of claim 1, wherein a shield is used to prevent deposition of the high-reflectance film on a portion of the low-reflectance substrate that does not contain the alignment mark.

3. The method of claim 1, wherein the high-reflectance film is deposited via sputtering.

4. The method of claim 1, wherein the high-reflectance film comprises TiN, Cu, or Al.

5. The method of claim 1, wherein the low-reflectance substrate comprises GaN or an Al/Ga/N/In alloy.

6. The method of claim 1, further comprising:
   depositing a photoresist on the portion of the high-reflectance film on the alignment mark;
   removing the portion of the high-reflectance film not protected by the photoresist; and
   removing the photoresist from the alignment mark.

7. The method of claim 6, wherein the portion of the high-reflectance film not protected by the photoresist is removed using $H_2O_2$.

8. The method of claim 7, further comprising removing $GaO_x$ generated by the reaction of GaN and $H_2O_2$.

9. The method of claim 8, wherein the $GaO_x$ is removed using $NH_4OH$.

10. The method of claim 1, wherein the high-reflectance film has a thickness of from about 200 angstroms to about 1000 angstroms.

11. The method of claim 1, wherein the reflectance is measured using a laser with a wavelength of about 632.8 nm.

12. A method for increasing reflectance of an alignment mark during production of an integrated circuit, comprising:
   depositing a high-reflectance material to form a layer on a GaN film that contains the alignment mark, the high-reflectance material having a higher reflectance than the GaN film;
   depositing photoresist on a portion of the high-reflectance layer on the alignment mark and leaving exposed a remaining portion of the high-reflectance layer;
   removing the exposed portion of the high-reflectance layer from the GaN film;
   removing the photoresist to expose the portion of the high-reflectance layer on the alignment mark; and
   removing any non-GaN material from the GaN film.

13. The method of claim 12, wherein the high-reflectance material is TiN.

14. The method of claim 12, wherein the high-reflectance material is removed using an oxidizer.

15. The method of claim 12, wherein the non-GaN material is GaOx.

16. The method of claim 12, wherein the non-GaN material is removed using a base.

17. The method of claim 12, wherein the high-reflectance layer has a thickness of from about 200 angstroms to about 800 angstroms.

18. An alignment mark on a low-reflectance substrate located upon a semiconducting wafer substrate, comprising a plurality of trenches in the low-reflectance substrate and a high-reflectance film deposited upon the plurality of trenches;
   wherein the high-reflectance film has a higher reflectance than the low-reflectance substrate; and
   wherein a trench top area is a sum of areas between the trenches and a trench bottom area is a sum of bottom areas of the trenches, and the ratio of the trench top area to the trench bottom area after deposition of the high-reflectance film is from about 0.8 to about 30.

19. The alignment mark of claim 18, wherein the substrate is GaN and the high-reflectance film is TiN.

20. The alignment mark of claim 18, wherein the plurality of trenches are parallel trenches; or
   wherein the plurality of trenches includes horizontal trenches and vertical trenches; or
   wherein the plurality of trenches are arranged to form a rectangular perimeter.

\* \* \* \* \*